(12) United States Patent
Mori et al.

(10) Patent No.: US 6,473,347 B2
(45) Date of Patent: Oct. 29, 2002

(54) SEMICONDUCTOR DEVICE HAVING MEMORY WITH EFFECTIVE PRECHARGING SCHEME

(75) Inventors: Katsuhiro Mori; Shinya Fujioka; Akihiro Funya, all of Kawasaki (JP)

(73) Assignee: Fujitsu Limited, Kanagawa (JP)

( * ) Notice: Subject to any disclaimer, the term of this patent is extended or adjusted under 35 U.S.C. 154(b) by 0 days.

(21) Appl. No.: 09/929,354

(22) Filed: Aug. 15, 2001

(65) Prior Publication Data

US 2002/0024847 A1 Feb. 28, 2002

(30) Foreign Application Priority Data

Aug. 31, 2000 (JP) ........................................ 2000-264357

(51) Int. Cl.$^7$ .............................................. G11C 7/100
(52) U.S. Cl. ................... 365/203; 365/201; 365/230.06
(58) Field of Search ............................ 365/201, 230.06, 365/203

(56) References Cited

U.S. PATENT DOCUMENTS

| 4,914,632 A | * | 4/1990 | Fujishima et al. ........... 365/201 |
| 5,381,373 A | * | 1/1995 | Ohsawa ....................... 365/201 |
| 5,615,164 A | * | 3/1997 | Kirihata et al. ......... 365/230.06 |
| 5,619,460 A | * | 4/1997 | Kirihata et al. ............. 365/201 |

* cited by examiner

*Primary Examiner*—Son Mai
(74) *Attorney, Agent, or Firm*—Arent Fox Kintner Plotkin & Kahn

(57) ABSTRACT

A semiconductor device includes a plurality of word lines selectable in a predetermined mode, and a circuit that precharges the plurality of word lines selected in the predetermined mode in a time division manner.

9 Claims, 8 Drawing Sheets

SEMICONDUCTOR DEVICE HAVING MEMORY WITH EFFECTIVE PRECHARGING SCHEME

CROSS REFERENCE TO RELATED APPLICATION

The present application is based on Japanese Priority Patent Application No. 2000-264357 filed on Aug. 31, 2001, the entire contents of which are hereby incorporated by reference.

BACKGROUND OF THE INVENTION

1. Field of the Invention

The present invention generally relates to semiconductor devices, and more particularly, to word line precharge in a semiconductor memory device such as a DRAM (Dynamic Random Access Memory).

2. Description of the Related Art

Semiconductor memory devices such as DRAMs are shipped after various tests thereof are completed. A stress test is performed in order to detect initial faults of semiconductor memory devices. The stress test is also called an acceleration test, and tests semiconductor memory devices in such a manner that parameters such as the electric field and temperature are set equal to values higher than those used in the actual environment.

For example, the stress test of semiconductor memory devices applies a voltage higher than that used normally to memory cells in order to inspect initial faults. In the stress test, it will take a very long time to select and precharge (reset) word lines one by one as in the case of the normal operation. Taking into account the above, a word line multi-selection test has been proposed.

In the word line multi-selection test, a plurality of word lines are sequentially selected at one time. Then, a single precharge command is externally applied to the semiconductor memory device. This makes it possible to precharge the selected word lines at one time.

However, a large number of word lines is precharged at one time only by applying the single precharge command to the device. This needs a large amount of peak current in precharging, and the ground potential VSS may float toward a positive power supply voltage VDD. Such floating of the ground potential VSS makes a "fault" decision on the device. In this case, it cannot be determined whether the fault results from an original or initial fault or one-time precharging of word lines.

SUMMARY OF THE INVENTION

A general object of the present invention is to provide a semiconductor device having a memory in which the above disadvantages are eliminated.

A more specific object of the present invention is to provide a semiconductor device having a memory in which the ground potential can be stably held even when a plurality of word lines are driven at one time.

The above objects of the present invention are achieved by a semiconductor device comprising: a plurality of word lines selectable in a predetermined mode; and a circuit that precharges the plurality of word lines selected in the predetermined mode in a time division manner. The above objects of the present invention are also achieved by a semiconductor device comprising: memory cell arrays; and a precharge controller precharging word lines of the memory cell arrays on an array basis in a time division manner.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
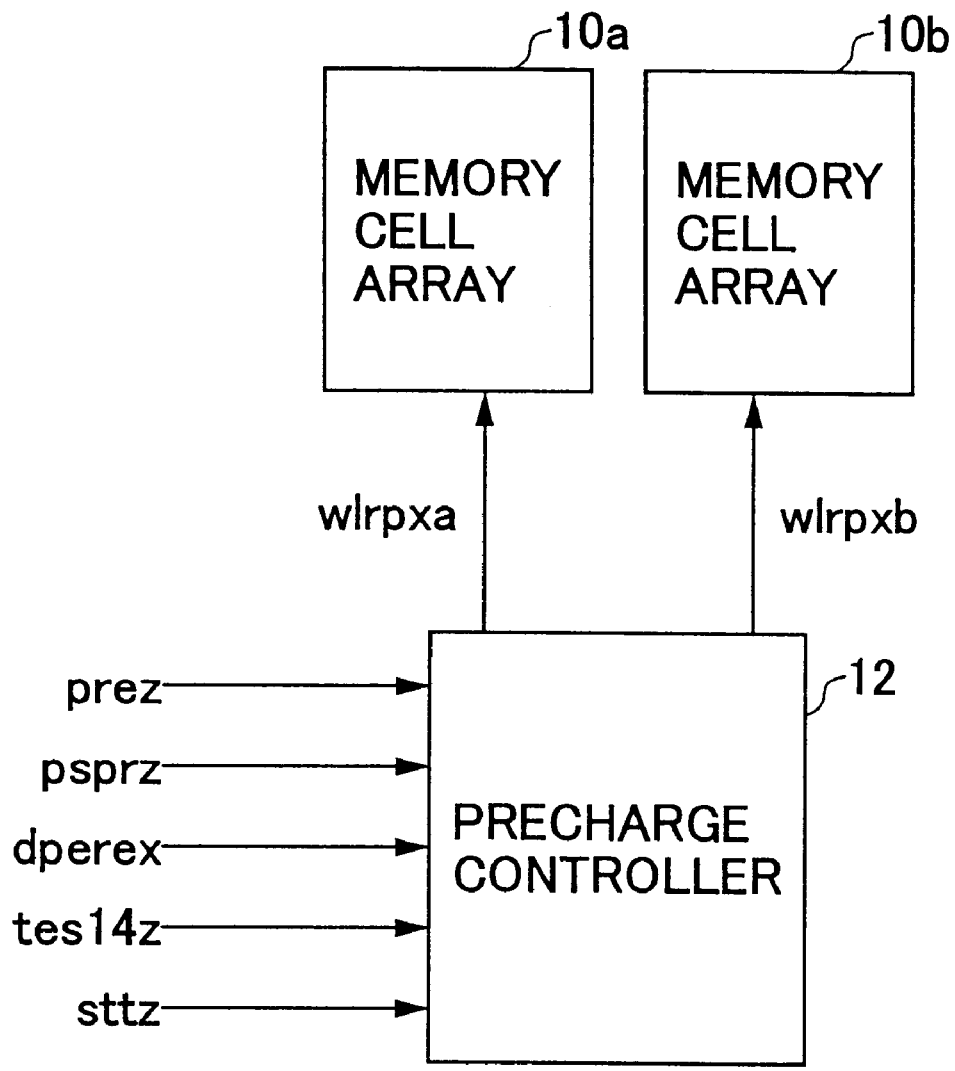
FIG. 1 is a block diagram of a semiconductor memory device according to an embodiment of the present invention.

FIG. 1 is a block diagram of a semiconductor memory device according to an embodiment of the present invention. The device includes two memory cell arrays 10a and 10b, and a precharge controller 12.

Figure 2:
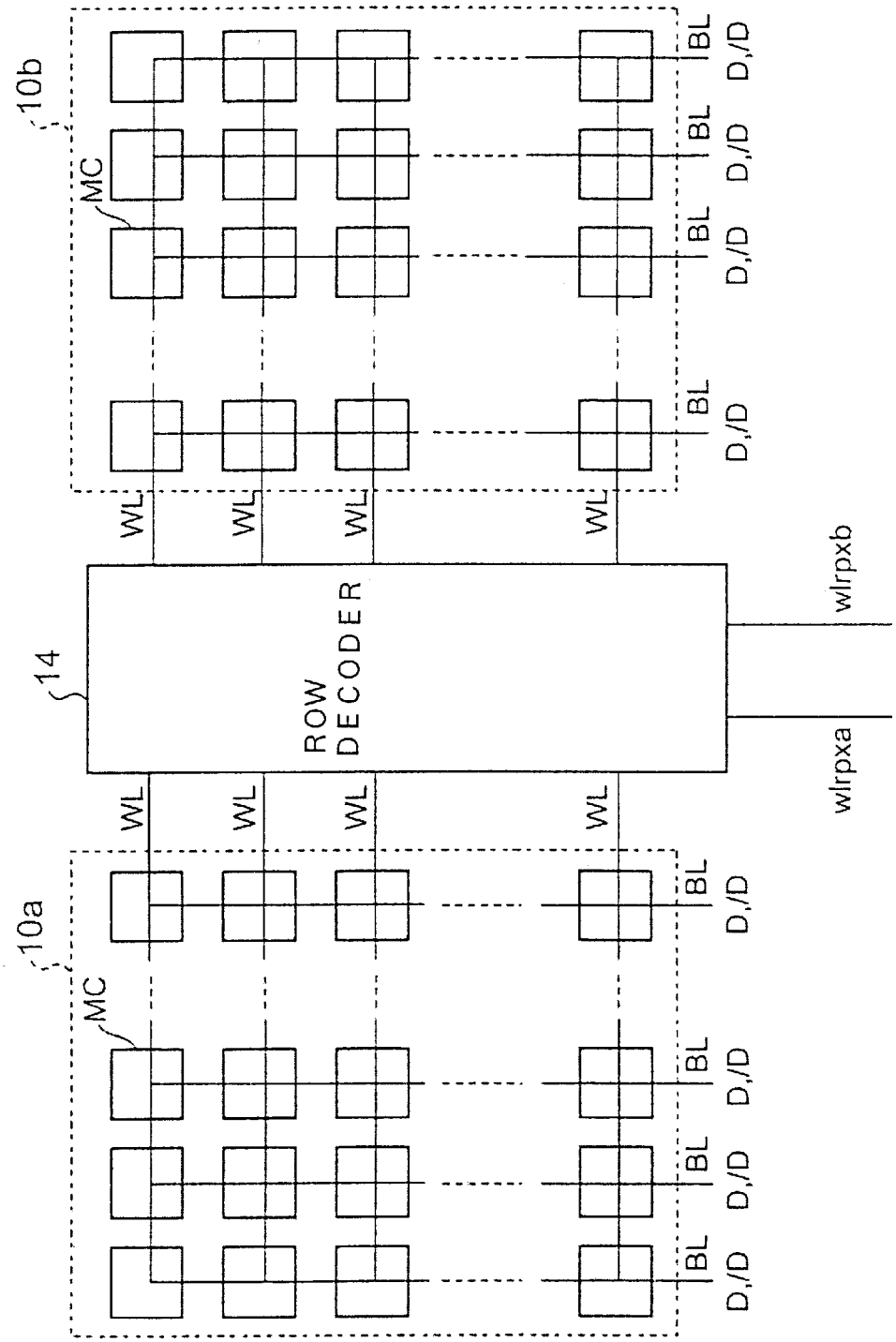
FIG. 2 is a diagram illustrating connections between two memory cell arrays and a row decoder shown in FIG. 1.

As shown in FIG. 2, two memory cell arrays 10a and 10b are connected to a row decoder 14. Each of the memory cell arrays 10a and 10b has a plurality of memory cells MC arranged in rows and columns. The memory cells MC are connected to word lines WL extending from the row decoder 14 and bit lines BL. Each of the bit lines BL has a pair of bits over which read or write data D, /D is transferred. The memory cell arrays 10a and 10b are obtained by dividing a memory cell array into two. Thus, word lines WL which are precharged at one time are divided into two groups.

Turning to FIG. 1 again, the precharge controller 12 receives signals prez, psprz, deprex, tes14z and sttz, and generate signals wlrpxa and wlrpxb for precharging the word lines WL of the memory cell arrays 10a and 10b.

The signal prez serves as a precharge command obtained by decoding a control signal externally supplied. Hereinafter, such a precharge command is referred to as an external precharge command.

The signal psprz is a precharge command automatically generated within the semiconductor memory device without the precharge command prez after read or write operation. Hereinafter, such a precharge command is referred to as an internal precharge command.

The signals dprex and tes14z are obtained by decoding the external control signal, and relates to a test mode.

Figure 3:
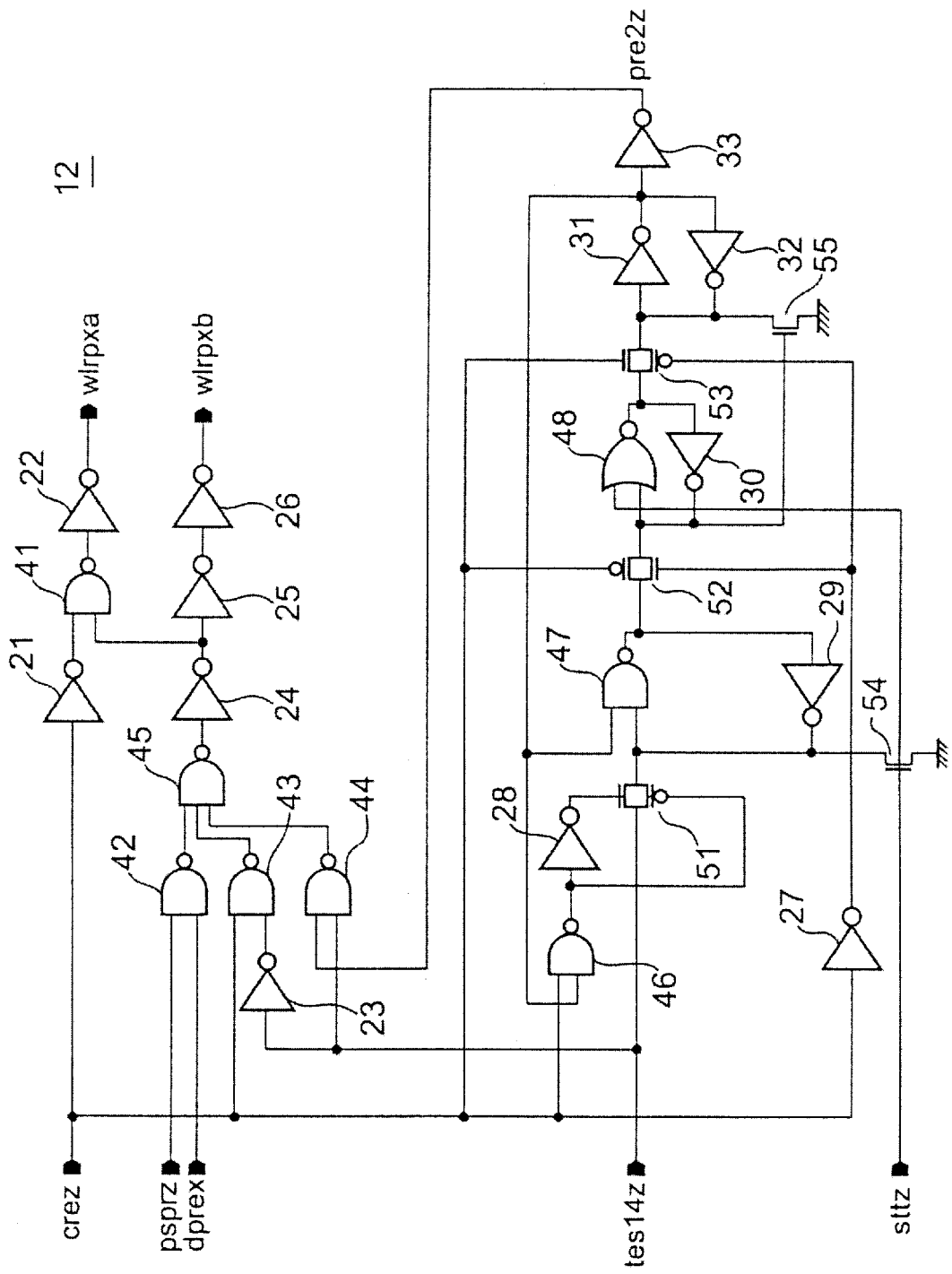
FIG. 3 is a circuit diagram of a structure of a precharge controller shown in FIG. 1.

The signal sttz serves as a starter signal, which initializes latch circuits (47, 29), (48, 30) and (31, 32) shown in FIG. 3 after power on, and switches to a high (H) level at the time of power on.

The signals wlrpxa and wlrpxb, which are generated by the precharge controller 12, instruct the memory cell arrays 10a and 10b to precharge the word lines. The precharge controller 12 can perform three controls with regard to precharge of word lines WL. The first control is a control in normal operation (normal mode). The word lines WL are selected one by the internal precharge command psprz, so that one word line can be precharged (reset) at one time. The second control is a test mode in which the word lines WL of the memory cell arrays 10a and 10b are precharged one by one in response to the external precharge command prez. The third control is a word line multi-selection test mode that is unique in the invention, and precharges the word lines WL of the memory cell arrays 10a and 10b in a time division manner by using the external precharge command prez and a signal pre2z. For example, all the word lines WL of the memory cell array 10a are precharged at one time, and then the word lines WL of the memory cell array 10b are precharged at tone time. It is to be noted that in prior art, all the word lines WL of the memory cell arrays 10a and 10b are precharged at one time. This causes a large peak current to flow in the memory cell arrays and the ground potential to float toward the positive side. In contrast, the present embodiment drives the word lines WL in the time division manner. It is therefore possible to reduce the peak current in precharging and prevent the ground potential from floating toward the positive side.

When the test mode signals dprex and tes14z are respectively at the high (H) and low (L) levels, the normal mode is designated. When the signals dprex and tes14z are both at the L level, a test mode using the external precharge command prez is designated. When the signals dprex and tes14z are respectively at the L and H levels, the word line multi-selection test mode is designated.

FIG. 3 is a circuit diagram of the precharge controller 12. The precharge controller 13 is made up of inverters 21–31, NAND gates 41–47, a NOR gate 48, transfer gates 51–53, and a transistor 55. The NAND gates 47 and the inverter 29 form a latch circuit. The NOR gate 48 and the inverter 30 form another latch circuit. The inverters 31 and 32 form yet another latch circuit.

Figure 4:
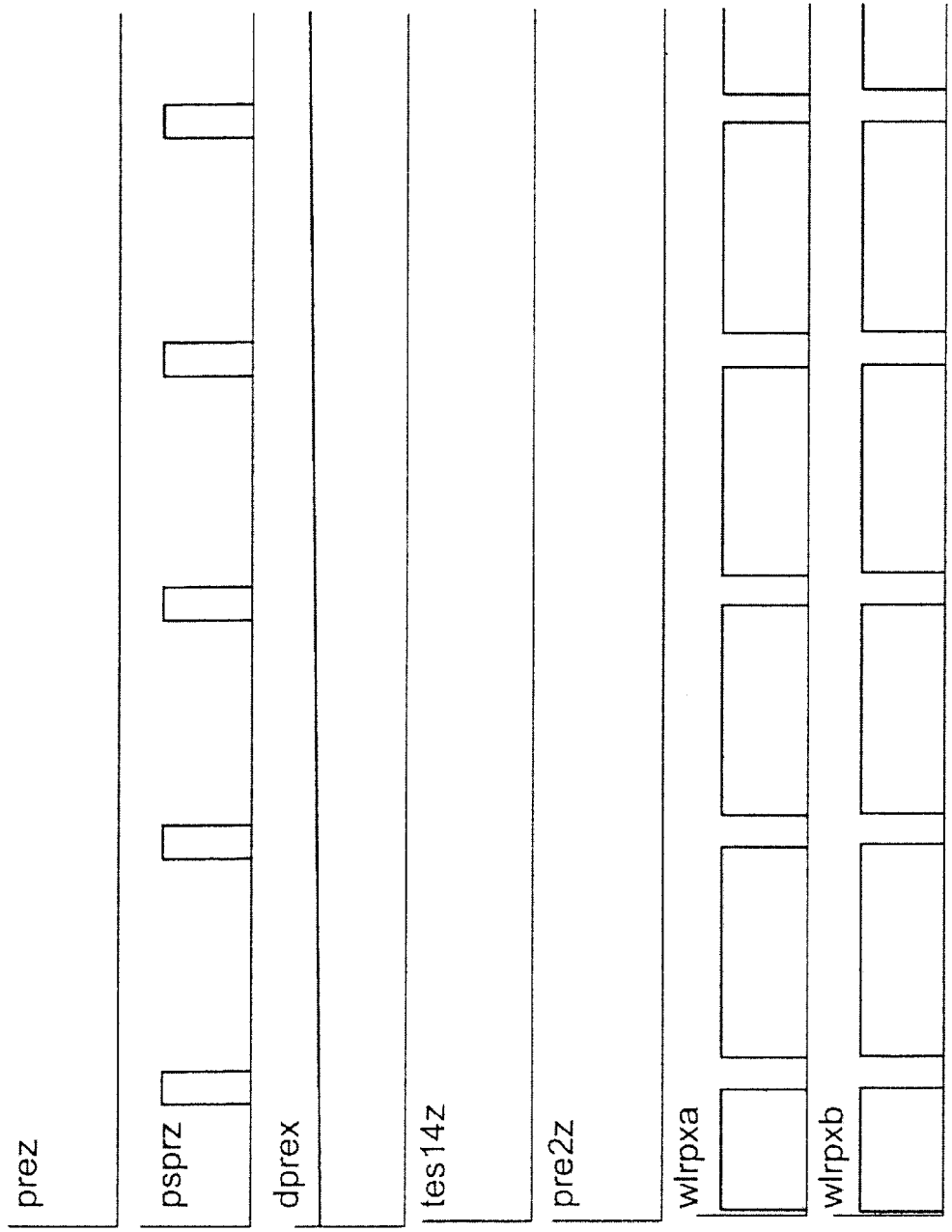
FIG. 4 is a timing chart of an operation of a precharge controller shown in FIG. 3.
Figure 5:
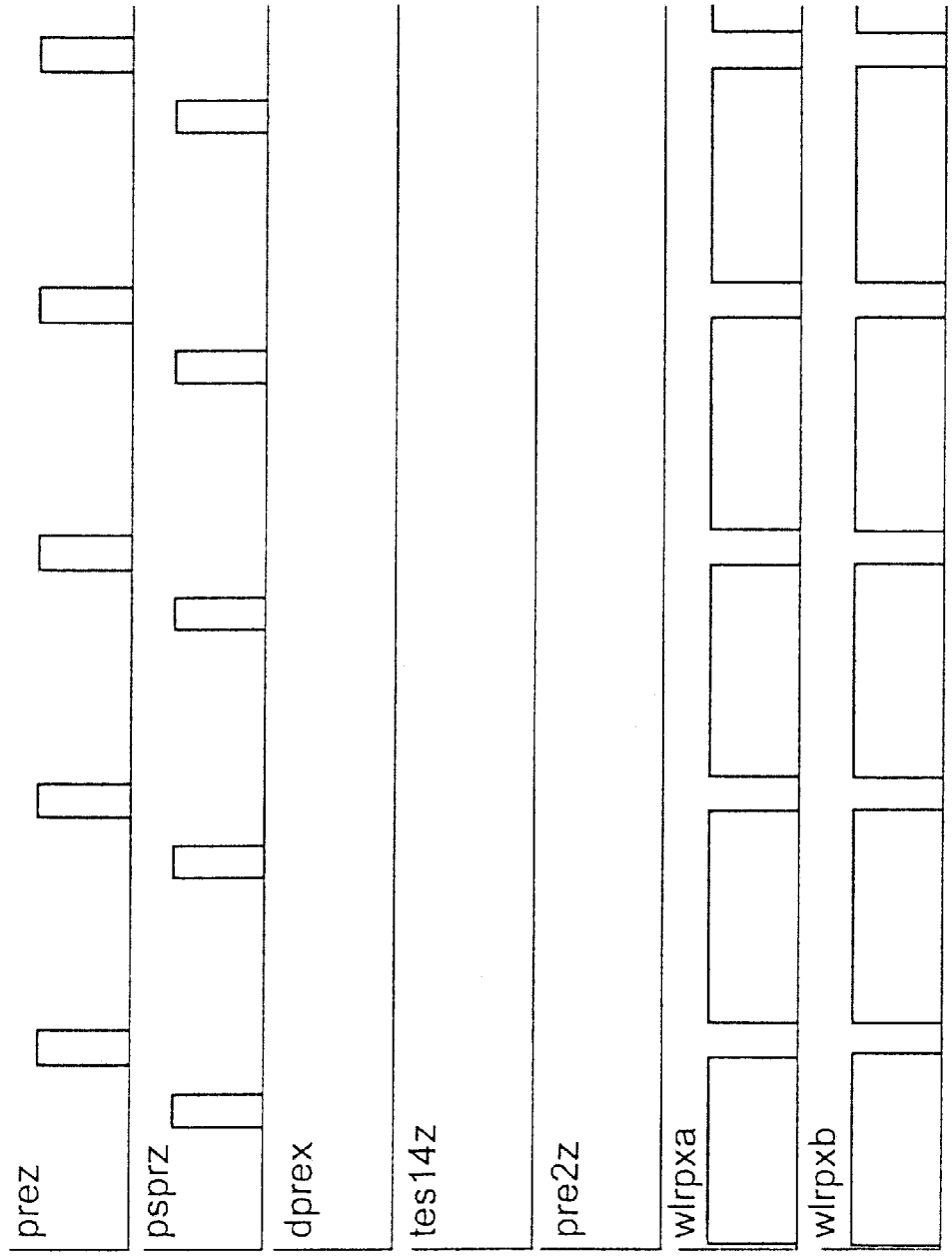
FIG. 5 is a timing chart of an operation in a test mode in which the precharge controller shown in FIG. 3 uses an external precharge command externally supplied.
Figure 6:
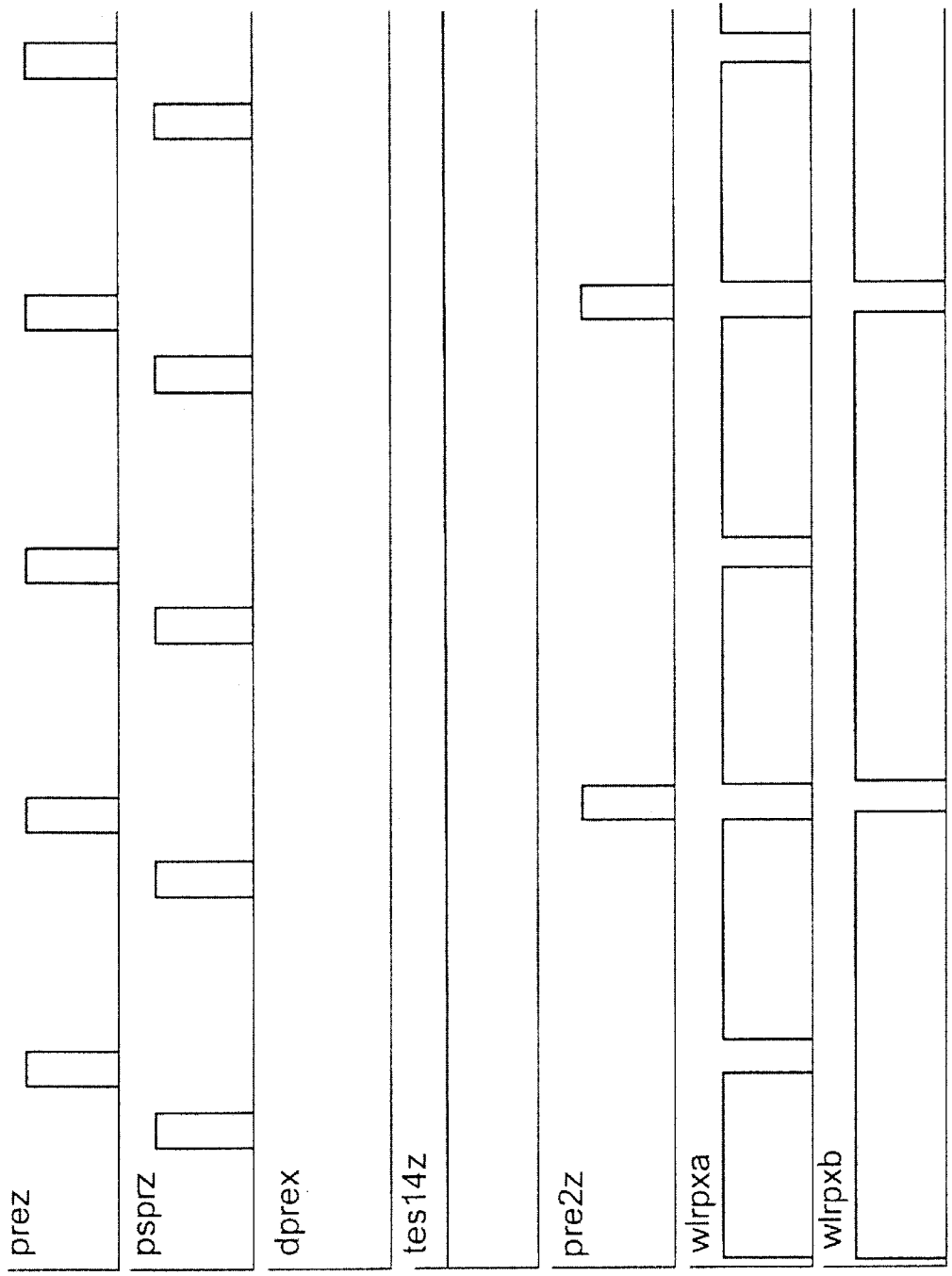
FIG. 6 is a timing chart of an operation in a word line multi-selection test mode of the precharge controller shown in FIG. 3.

FIGS. 4, 5 and 6 are timing charts of operations of the precharge controller 12 shown in FIG. 3. More particularly, FIG. 4 shows an operation in the normal mode, FIG. 5 shows an operation in the test mode with the external precharge command prez, and FIG. 6 shows an operation in the word line multi-selection test mode. In FIGS. 4 through 6, the aforementioned signal pre2z is the output signal of the inverter 33.

Referring to FIG. 4, in the normal operation, the external precharge signal prez is set equal to L (ground potential VSS), the test signal dprex is set equal to H, and the test signal tes14z is set equal to L. Although not illustrated, the starter signal sttz is set at L. The internal precharge signal psprz, which is a pulse signal, is applied to the NAND gate 42 of the precharge controller 12. In this case, the internal precharge signal psprz changes from L to H. Then, the output signal of the NAND gate 42 changes from H to L. Immediately before this change, the output signals of the NAND gates 43 and 44 are both at H. Thus, when the internal precharge command psprz changes from L to H, the output signal of the NAND gate 45 changes from L to H, and the precharge signal wlrpxb changes from H to L. Since the output signal of the NAND gate 41 changes from L to H, the precharge signal wlrpxa changes from H to L. When the internal precharge signal psprz returns to L, the precharge signals wlrpxa and wlrpxb return to H from L. In response to the pulse-like precharge signals wlrpxa and wlrpxb thus generated, a single word line in each of the memory cell arrays 10a and 10b is precharged by the row decoder 14 shown in FIG. 2.

Referring to FIG. 5, in the test mode using the external precharge command prez, this command is applied to the precharge controller 12. At this time, the test signals dprex and tes14z are respectively set equal to L and L. Since the test signal dprex is at L, the output signal of the NAND gate 42 remains at H even when the internal precharge command psprz changes to H. Thus, the internal precharge command psprz is masked. When the external procharge command prez changes to H, the output of the NAND gate 43 changes to H from L, while the outputs of the NAND gate 45 changes to L from H. Thus, in response to the external precharge command prez, the precharge signals wlrpxa and wlrpxb are generated.

Referring to FIG. 6, in the word line multi-selection mode, the external precharge command prez and the internal precharge command psprz are applied to the precharge controller 12 as shown. In the word line multi-selection mode, the test signals dprex and tes14z are respectively set equal to L and H. Since the transfer gate 53 is OFF, there is no change of the output of the inverter 33. Thus, even when the test signal tes14z changes to H, the output signal of the NAND gate 44 remains at H. As a result of the above operation, the precharge signals wlrpxa and wlrpxb do not change but remain at H.

Then, the internal precharge command psprz changes from L to H. Since the test signal dprex is at L, the output signal of the NAND gate 42 remains at H. Thus, the precharge signals wlrpxa and wlrpxb do not change but remain at H.

Further, the external precharge command prez is applied. When the external precharge command prez changes from L to H, the output of the NAND gate 46 changes from H to L, and the transfer gate 51 is turned ON. Since the signal tes14z is at H, the output signal of the NAND gate 47 changes to L. The transfer gates 52 is turned OFF from ON, while the transfer gate 53 is turned ON from OFF. The output of the NOR gate 48 remains in the initial state without no change and is at L. The output of the NOR gate 48 passes through the transfer gate 53, and is latched by the latch circuit composed of the inverters. 31 and 32. The output pre2z of the inverter 33 remains at L and no change occurs. Hence, the output of the NAND gate 44 remains at H, and the output of the NAND gate 45 remains at L. Thus, the precharge signal wlrpxb does not change but remains at H, and the word lines WL of the memory cell array 12b are not precharged. When the external precharge command prez changes to L from H, the transfer gates 51 and 53 are turned OFF, and the transfer gate 52 is turned ON. Then, the output L of the NOR gate 47 is input to the NOR gate, and its output H is latched.

In contrast, when the external precharge command prez changes from L to H, the output signal of the NAND gate 41 changes from L to H. Thus, the precharge signal wlrpxa changes from H to L. Upon receiving the above change of the precharge signal wlrpxa, the row decoder shown in FIG. 2 precharges all the selected word lines WL at one time.

Next, the internal precharge command psprz is supplied to the precharge controller 12. However, the precharge signals wlrpxa and wlrpxb do not change.

Then, the next external precharge command prez is applied, and the transfer gate 53 is changed from OFF to ON. Thus, the output H of the NOR gate 48 is applied to the inverter 31, the output of which is latched at L. Thus, the output pre2z of the inverter 33 changes from L to H. In response to the above change, the output signal of the NAND gate 44 changes from H to L, and the output of the NAND gate 45 changes from L to H. Thus, both the precharge signals. wlrpxa and wlrpxb change from L to H. In response to these changes of the precharge signals wlrpxa and wlrpxb, the row decoder shown in FIG. 2 precharges all the selected word lines WL of the memory cell arrays 10a and 10b at one time. In this case, the word lines WL of the memory cell array 10a have been precharged, the word lines WL of only the memory cell array 10b are precharged. When the external precharge command prez changes from H to L, the latch circuits (47, 29), (48, 30) and (31, 32) return to the initial states, in which no precharge commands have been applied at all. The next (third) precharge command prez is deemed to be the first one.

In the above-mentioned manner, all the word lines WL of the memory cell array 10a are precharged by the external precharge command prez applied first, and all the word lines WL of the memory cell array 10b are then precharged by the external precharge command prez applied second. Thus, the peak current in precharging can be distributed, which prevents the ground potential VSS from floating toward the positive side.

Figure 7:
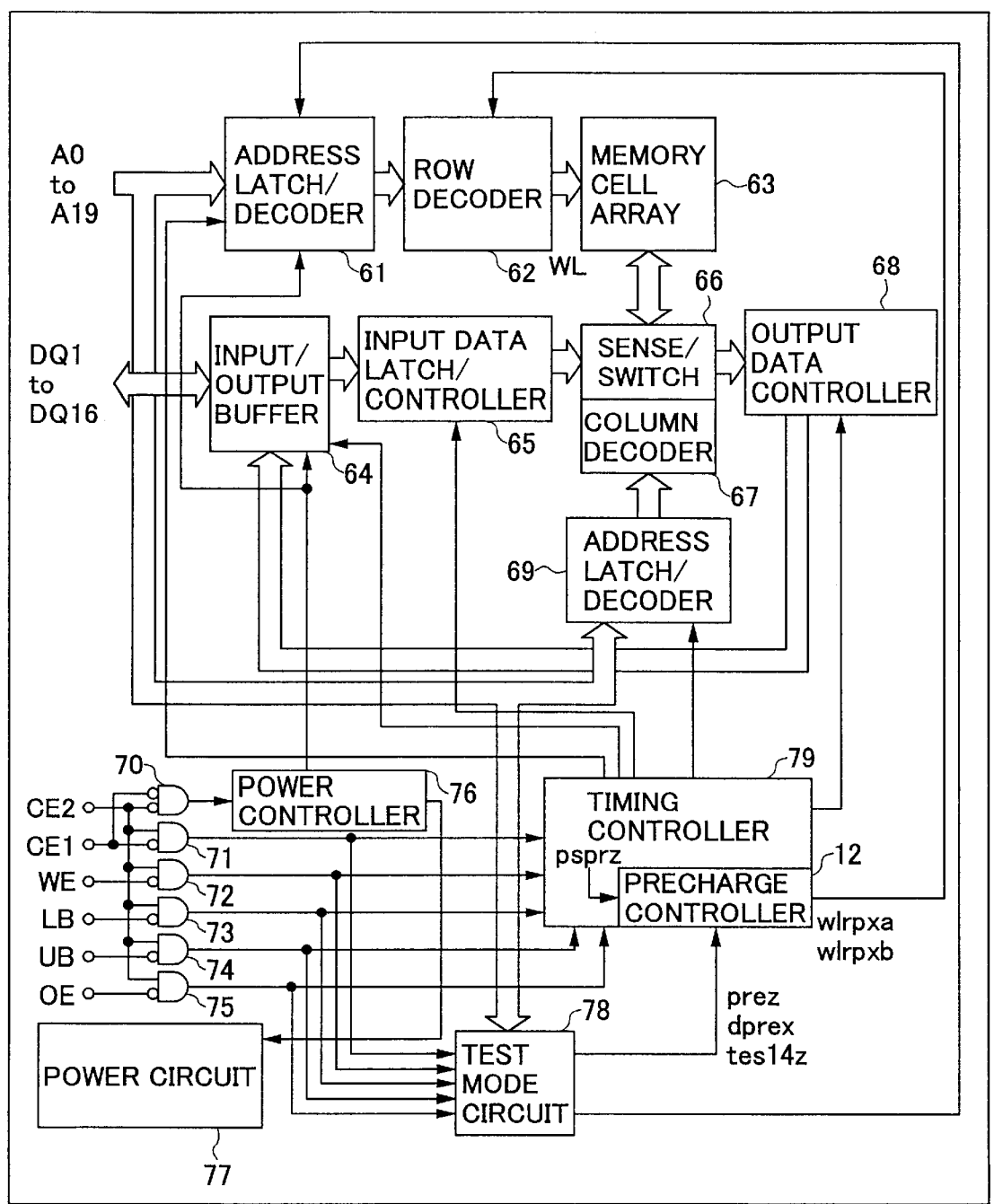
FIG. 7 is a block diagram of an entire configuration of a semiconductor memory device according to an embodiment of the invention.

FIG. 7 is a block diagram of an entire structure of a semiconductor memory device 60 according to an embodiment of the invention. The device 60 includes an address latch/decoder 61, a row decoder 62, a memory cell array 63, an input/output buffer 64, an input data latch/controller 65, a sense/switch 66, a column decoder 67, an output data controller 68, an address latch/decoder 69, gates 70–75, a power controller 76, a power supply circuit 77, a test mode circuit 78, and a timing controller 79.

The precharge controller 12 shown in FIG. 1 is provided within the timing controller 79. The gates 70–75 receive control signals from the outside of the device, and output respective logical outputs to the associated parts. The external control signals supplied from the outside of the device are chip enable signal /CE1, CE2, a write enable signal /WE, lower and upper data mast signals /LB and /UB, and an output enable signal /OE. The logical outputs of the gate circuits 71–75 are supplied to the test mode circuit 78. The test mode circuit 78 decode various commands defined by combinations of the logical outputs, and supplies the timing controller 79 and the address latch/decoder 61 with resultant signals. The signals that are output to timing controller 79 are the aforementioned external precharge command prez and the test signals dprex and tes14z.

The timing controller 79 internally generates the internal precharge command psprez, and supplies it to the precharge controller 12. As has been described previously, the precharge controller 12 generates the precharge signals wlrepxa and wlrpxb, which are then applied to the row decoder 62. The row decoder 14 shown in FIG. 2 corresponds to the row decoder 62 shown in FIG. 7. The memory cell array 63 corresponds to the memory cell arrays 101 and 10b shown in FIGS. 1 and 2.

In the word line multi-selection test mode, the address signals A0–A19 are successively supplied, so that the word lines of the memory cell arrays 10a and 10b can be selected in multiple fashion via the address latch/decoder 61 and the row decoder 62. In response to the precharge signals wlrpxa and wlrpxb, all the word lines WL are precharged (reset) at one time.

Figure 8:
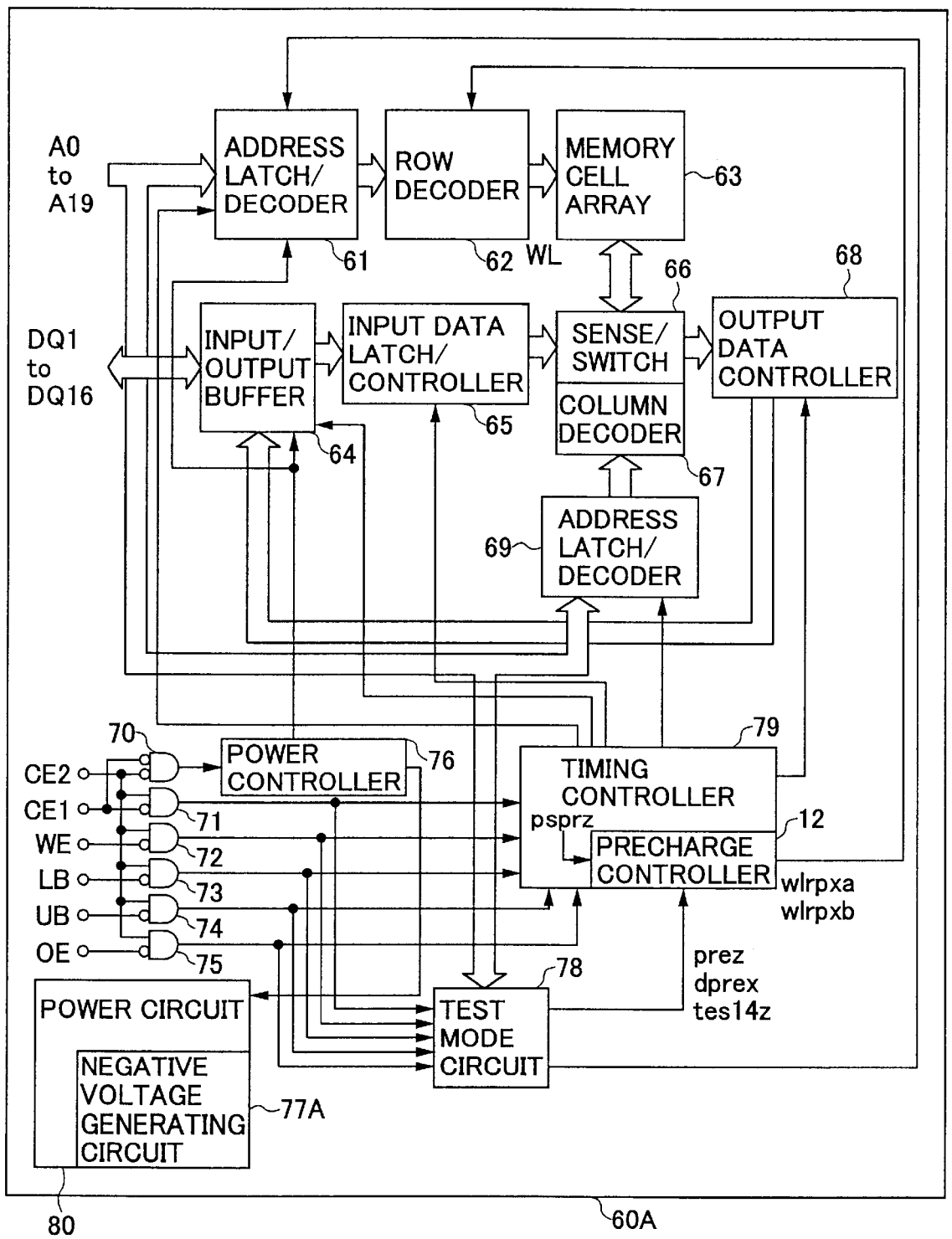
FIG. 8 is a block diagram of another entire configuration of a semiconductor memory device according to another embodiment of the invention.

FIG. 8 shows a variation of the structure shown in FIG. 7 configured by adding a negative voltage generating circuit 80 thereto. The structure shown in FIG. 7 precharges the word lines WL to the ground potential VSS, while the structure shown in FIG. 8 precharges the word lines WL to a negative potential lower than the ground potential VSS. The negative voltage generating circuit 80 serves as a power source, which generates a negative voltage for precharging the word lines WL to the negative potential. For example, the negative voltage generating circuit 80 is equipped with a negative charge pump.

The reason why the word lines WL are precharged to a negative potential is intended to support recent voltage lowering. The voltage lowering reduces the threshold voltage of the cell transistors. When the word lines WL are reset to the negative potential, a larger dynamic range of operation can be ensured.

It may be conceivable to reset the word lines to a negative potential in the conventional word line multi-selection test mode. However, all the word lines are reset to the negative potential at one time. This needs a negative voltage generating circuit having an extremely large driving capability. In contrast, according to one aspect of the invention, the word lines WL of the memory cell array 63 are precharged in the time-division manner for each of the memory cell arrays 10a and 10b (on the array basis). Hence, principally, the negative voltage generating circuit 80 shown in FIG. 8 may have a driving capacity that is half that of the conventional circuit. This makes it possible to reduce power consumption and the circuit area.

In the foregoing description, the memory cell array is divided into two. The present invention includes other embodiments in which the memory cell array is divided into three or more. The above-mentioned device is a semiconductor memory device. However, the present invention includes all semiconductor devices having a memory.

According to one aspect of the present invention, it is possible to stably hold the ground potential even when a plurality of word lines are driven at one time.

The present invention is not limited to the specifically disclosed embodiments, and variations and modifications may be made without departing from the scope of the invention.

What is claimed is:

1. A semiconductor device comprising:

a plurality of word lines selectable in a predetermined mode; and a circuit that precharges the plurality of word lines selected in the predetermined mode in a time division manner.

2. A semiconductor device comprising:

a plurality of word lines selectable in a predetermined mode, the plurality of word lines being divided into groups; and a circuit that precharges a selected one of the groups of word lines in a time division manner.

3. The semiconductor device as claimed in claim 2, wherein the circuit selects one of the groups by a precharge command externally supplied.

4. The semiconductor device as claimed in claim 2, wherein the word lines of an identical group are simultaneously precharged.

5. The semiconductor device as claimed in claim 3, wherein the word lines of an identical group are simultaneously precharged.

6. A semiconductor device comprising:

memory cell arrays; and a precharge controller precharging word lines of the memory cell arrays on an array basis in a time division manner.

7. The semiconductor device as claimed in claim 6, wherein the precharge controller includes a circuit that selects one of the memory cell arrays, and generates a signal for precharging word lines of a selected memory cell array at one time.

8. The semiconductor device as claimed in claim 1, wherein the predetermined mode is a test mode.

9. The semiconductor device as claimed in claim 6, wherein the predetermined mode is a test mode.

* * * * *

UNITED STATES PATENT AND TRADEMARK OFFICE
CERTIFICATE OF CORRECTION

PATENT NO.    : 6,473,347 B2
DATED         : October 29, 2002
INVENTOR(S)   : Mori et al.

It is certified that error appears in the above-identified patent and that said Letters Patent is hereby corrected as shown below:

<u>Title page,</u>
Item [73], please change the Assignee's address from "Kanagawa" to -- Kawasaki --.

Signed and Sealed this

Eighth Day of April, 2003

JAMES E. ROGAN
*Director of the United States Patent and Trademark Office*

UNITED STATES PATENT AND TRADEMARK OFFICE
CERTIFICATE OF CORRECTION

PATENT NO.      : 6,473,347 B2                                           Page 1 of 1
DATED           : October 29, 2002
INVENTOR(S)     : Katsuhiro Mori et al.

It is certified that error appears in the above-identified patent and that said Letters Patent is hereby corrected as shown below:

<u>Title page,</u>
Item [75], Inventors, please correct the third inventor's name from "Akihiro Funya" to -- Akihiro Funyu --.

Signed and Sealed this

Sixth Day of January, 2004

JAMES E. ROGAN
*Director of the United States Patent and Trademark Office*